United States Patent [19]

Carlson

[11] 4,029,868

[45] June 14, 1977

[54] TETRAFLUOROETHYLENE TERPOLYMERS

[75] Inventor: Dana Peter Carlson, Parkersburg, W. Va.

[73] Assignee: E. I. Du Pont de Nemours and Company, Wilmington, Del.

[22] Filed: Mar. 10, 1976

[21] Appl. No.: 665,548

[52] U.S. Cl. .................................................. 526/247
[51] Int. Cl.² ........................................ C08F 214/26
[58] Field of Search .................................. 526/247

[56] References Cited

UNITED STATES PATENTS

| | | | |
|---|---|---|---|
| 3,546,186 | 12/1970 | Gladding et al. | 526/247 |
| 3,770,711 | 11/1973 | Hartig et al. | 526/247 |
| 3,819,594 | 6/1974 | Holmes et al. | 526/247 |
| 3,855,191 | 12/1974 | Doughty et al. | 526/247 |
| 3,864,322 | 2/1975 | Yallourakis | 526/247 |

Primary Examiner—Harry Wong, Jr.

[57] ABSTRACT

Terpolymers of tetrafluoroethylene, hexafluoropropylene and either perfluoro(propyl vinyl ether) or perfluoro(ethyl vinyl ether) are described which are prepared by polymerizing the monomers in the presence of a chlorofluoroalkane or chlorofluorohydroalkane solvent and a chain transfer agent and an initiator in either an aqueous or nonaqueous medium. The terpolymers are useful as films, fibers or tubes.

3 Claims, No Drawings

TETRAFLUOROETHYLENE TERPOLYMERS

FIELD OF THE INVENTION

This invention relates to fluorinated terpolymers, and more particularly to terpolymers of tetrafluoroethylene, hexafluoropropylene and either perfluoro(ethyl vinyl ether) or perfluoro(propyl vinyl ether).

BACKGROUND OF THE INVENTION

Polytetrafluoroethylene (PTFE) is well known for its outstanding chemical, physical and electrical properties. The unique combination of properties of PTFE has made it a particularly valuable plastic for a variety of applications including electrical wire insulations, bearing pads, gasketing materials and pipe linings. However, a disadvantage of PTFE is its extremely high melt viscosity which makes melt fabrication of the polymer impossible. A solution to this problem was found by copolymerizing TFE with certain perfluorinated monomers. In particular, copolymerizing tetrafluoroethylene (TFE) with hexafluoropropylene (HFP) has been found to provide tough, stable melt extrudable TFE/HFP copolymers (see e.g., U.S. Pat. No. 2,946,763). Copolymerizing TFE with perfluoro(alkyl vinyl ethers), e.g., perfluoro(propyl vinyl ether), (PPVE), has also been found to provide tough, stable melt extruable perfluorocarbon polymers such as TFE/PPVE copolymers (see e.g., U.S. Pat. No. 3,132,123).

A TFE/HFP copolymer, which is used commercially under the name Teflon FEP resin, is capable of being fabricated at practical rates into thin, continuous shaped articles such as film, tubing and the like by conventional thermoplastic processing techniques. Although these TFE/HFP copolymers have outstanding properties and are used in a variety of applications, they have some disadvantages relative to PTFE homopolymers. For example, in order to lower the melt viscosity sufficiently to permit melt fabrication of the TFE/HFP copolymer and still obtain good toughness, more than 15 weight percent of HFP is usually incorporated in the copolymer. This has the effect of lowering the melting point of the copolymer by at least about 60° C. relative to that of PTFE. Further, the large amount of HFP present has an adverse effect on the high temperature mechanical properties, e.g., it lowers tensile strength, of the copolymer. As a result, the upper use temperature for usual applications of these TFE/HFP copolymers is more than 60° C. lower than that of PTFE. Also, these TFE/HFP copolymers possess a lower MIT flex life relative to PTFE homopolymer. A need existed for development of a fluorocarbon resin having the low melt viscosity of TFE/HFP copolymers but without the attendant lowering of tensile strength at high temperatures and lowering of the flex life.

The need referred to above was partially met by copolymers of tetrafluoroethylene and certain perfluoro-(alkyl vinyl ethers). These copolymers (referred to herein as TFE/PAVE copolymers) have good high temperature mechanical properties and toughness, and have melt viscosities low enough to permit fabrication by conventional thermoplastic processing techniques. However, good properties of these thermoplastic copolymers are achieved only with more than 3 weight percent of the vinyl ether present. The high cost of these vinyl ether monomers precluded their use in many applications and has led to continued interest in developing improved melt fabricable tetrafluoroethylene copolymers with litle or no cost penalty.

Moreover, an important use of the TFE/HFP copolymers is in making heat-shrinkable tubing and the TFE/PAVE copolymers were less satisfactory for this use than the TFE/HFP copolymers because of their higher instantaneous "snap-back" tendency when stretching forces are removed.

Thus, a need existed for a fluorocarbon resin having the low melt viscosity with good tensile strength at high temperatures and good flex life, and having low snap-back tendencies.

SUMMARY OF THE INVENTION

The terpolymers provided by this invention are fluorocarbon polymers havng a melt viscosity low enough to permit fabrication by conventional thermoplastic processing techniques, having a high temperature tensile strength superior to that of TFE/HFP copolymers, a flex life approaching or surpassing that of TFE/HFP copolymers, and having low snap-back tendencies when stretching force is removed compared to TFE/PAVE copolymers.

The terpolymers provided by this invention contain, in copolymerized form
a. tetrafluoroethylene,
b. between about 4 to about 12 weight percent hexafluoropropylene, and
c. between about 0.5 and about 3 weight percent of either perfluoro(ethyl vinyl ether) or perfluoro(n-propyl vinyl ether), said weight percents being based on weight of terpolymer.

DESCRIPTION OF THE INVENTION

The terpolymers of this invention can be prepared by the nonaqueous procedure described in U.S. Pat. No. 3,528,954. In this procedure, a pressure reactor, e.g., a stainless steel autoclave, is usually used. A solvent which contains the perfluoro(alkyl vinyl ether) and a chain transfer agent is added. Usually the solvent is 1,1,2-trichloro-1,2,2-trifluoroethane (F-113), but it can be a chlorofluoroalkane or a chlorofluorohydroalkane having from 1–4 carbon atoms and preferably 1–2 carbon atoms. Examples include $CCl_2F_2$, $CCl_3F$, $CClF_2H$, $CCl_2FCCl_2F$, $CCl_2FCClF_2$ and $CClF_2CClF_2$.

The chain transfer agent is preferably methanol, but can be 2-hydroheptafluoropropane, cyclohexane, chloroform, isopropanol, dichloromethane, ethanol and the like.

The desired amount of hexafluoropropylene is then added and the autoclave heated to the desired reaction temperature; usually 45°–65° C., but sometimes 30°–85° C. The reaction vessel is then pressured with tetrafluoroethylene. The reaction can be carried out at pressures from about 15 to about 1000 psig, but preferably is carried out at between from 50 to 500 psig. Then the initiator is added.

The initiator should be one that is soluble in the solvent and has high activity at the temperature used. Fluorocarbon acyl peroxides of the formula

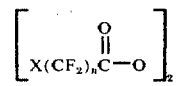

where X is H or F and $n$ is an integer of 1–10, are preferred. The preferred initiator is bis(perfluoropropionyl) peroxide. Preferably a solution of the initiator is injected into the reaction vessel continuously, after its initial charge, at a rate at least equal to its decomposition rate. Initiator concentration in the reaction mixture is usually between about $0.5 \times 10^{-4}$ and $5 \times 10^{-4}$ g./ml.

The pressure is kept constant during the reaction by repressuring with tetrafluoroethylene monomer.

The reaction is then allowed to proceed until the desired degree of polymerization is obtained. The contents of the reaction vessel are then discharged and dried to remove solvent. Drying is carried out by ordinary means, e.g., by drying in an air oven.

The terpolymers of this invention can also be prepared by an aqueous procedure described in U.S. Pat. No. 3,635,926. In this procedure, the stainless steel autoclave is charged with a gaseous chain transfer agent such as ethane, the perfluoro(alkyl vinyl ether) and an organic solvent described above. The HFP is then added, followed by an initiator described above, but preferably ammonium persulfate or a diacyl peroxide, that is dissolved in water. Sufficient water is added to reduce the organic solvent to a minor proportion compared to the water. Tetrafluoroethylene is pressured into the autoclave and the polymerization is carried out as described above.

The terpolymers of this invention contain units, in randomly polymerized form, of tetrafluoroethylene, hexafluoropropylene in an amount of between about 4 and 12 weight percent based on weight of terpolymer (and perferably between about 5 and 8 weight percent) and perfluoro(n-propyl vinyl ehter) or perfluoro(ethyl vinyl ether) in an amount of between about 0.5 and 3 weight percent based on weight of terpolymer, and preferably between about 0.75 and 2.0 weight percent. Use of perfluoro(methyl vinyl ether) in such amounts does not result in terpolymers of good flex life.

The terpolymers are melt-fabricable, i.e., can be processed in ordinary apparatus used in shaping and molding thermoplastic polymers. Thus, the melt viscosity of the terpolymers is lower than that of polytetrafluoroethylene, which cannot be melt-fabricated. Usually the melt viscosity of the terpolymers will be below about $10^7$ poise, and ordinarily will be between about $10^3$ and $10^7$ poise, preferably between $10^4$ and $10^6$ poise, measured at $372°$ C. The melt viscosity is measured according to ASTM D-1238-52T modified by using a cylinder, orifice and piston tip made of a corrosion-resistant alloy (Haynes Stellite 19), by charging a 5.0 g. sample to the 9.53 mm inside diameter cylinder which is maintained at $372°$ C. $\pm$ 1° C., and by extruding the sample 5 minutes after charging through a 2.10 mm diameter, 8.00 mm long square-edged orifice under a load (piston plus weight) of 5000 g. (This corresponds to a shear stress of 0.457 kg./cm.$^2$). The melt viscosity in poises is calculated as 53150 divided by the observable extrusion rate in grams per minute.

The terpolymers have high thermal stability, good tensile strength at high temperatures, good flex life, low flammability, chemical inertness, anti-stick properties and low friction properties which approach those of the homopolymer polytetrafluoroethylene, yet the terpolymers possess the advantage of being melt-processible, which advantage is not possessed by polytetrafluoroethylene. The terpolymers have melting points generally only between about 20° and 50° C. below that of PTFE and preferably only about 20° to 30° C. below PTFE, while in contrast, useful TFE/HFP copolymers have melting points about 60° C. or more lower than PTFE. Thus, the high temperature strength and the flex life of the terpolymers of the invention are better than those of the TFE/HFP copolymers.

The terpolymers of the invention are useful as electrical insulation wire, chemical-resistant linings for pipes and valves, chemical-resistant containers, non-stick roll covers, chute liners, and the like.

In the following Examples, the terpolymer characterization employed the following tests:

1. Melt Viscosity

Melt viscosities were determined as described previously.

2. Terpolymer Composition a. Hexafluoropropylene (HFP) Content

The HFP content is determined by measurement of the ratio of the IR absorbance at 10.18 microns (982 cm.$^{-1}$) and the absorbance at 4.25 microns (2365 cm.$^{-1}$). This ratio is referred to as the HFP index, or the HFPI. The IR measurements were made using a model 237-B "Infracord" spectrophotometer. The scans were run at slow speed under a nitrogen atmosphere. Approximately 0.05 mm thick compression molded films were used for the measurements. However, for TFE/HFP/PPVE terpolymers, the PPVE band at 995 cm.$^{-1}$ overlaps the HFP band at 982 cm.$^{-1}$. Thus, the HFPI for these terpolymers had to be corrected for the contribution from the PPVE band. The amount of PPVE in the terpolymer was determined by a different procedure, which is described below. A correction to the HFPI determination was found to be 0.25 times the weight percent of PPVE in the terpolymer. This formula for correcting the HFPI is shown below.

HFPI (Corrected) = HFPI (measured) $- 0.25 \times$ wt. % PPVE. The relationship between the HFPI and HFP content is as follows:
HFP, wt. % = 4.5 × HFPI.

b. Perfluoropropyl vinyl ether (PPVE) Content

The PPVE content of TFE/HFP/PPVE terpolymers is determined from the measurement of the absorbance band at 1340 cm.$^{-1}$. A 0.1 to 0.15 mm. film of the sample is hot-pressed at 350° C. between aluminum foil sheets, and cooled in the press to below the melting point of the terpolymer. A TFE/HFP copolymer film of the same thickness (to within 0.005 to 0.008 mm.) is pressed. Each film is scanned through the 2365 cm.$^{-1}$ band. If the films differ by more than 0.03 absorbance units, more closely matched films are prepared. When a match is obtained at 2365 cm.$^{-1}$, the absorbance of the terpolymer film at 1340 cm.$^{-1}$, compensated by the TFE/HFP copolymer film, is determined. Due to the large amount of compensating absorbance in the reference beam, the pen response will be slow. The scan is stopped at the band maximum and checked to see that pen response is adequate for the scan speed being used. If not, the instrument parameters are readjusted and the spectrum rerun. Since total adsorption occurs just beyond the maximum, the base line is taken by extrapolation from the high-frequency side of the band. The method is calibrated using the TFE/PPVE copolymer film of known PPVE content. The relationship between absorbance at 1340 cm.$^{-1}$ and PPVE content is approximately as follows:

PPVE, wt. % = 1.25 × ab. units (1340 cm.$^{-1}$)/mm.

c. PEVE and PMVE Contents

The termonomer contents of the terpolymers containing PEVE (perfluoroethyl perfluoro vinyl ether) as well as PMVE (perfluoromethyl perfluoro vinyl ether) were also determined by infrared spectroscopy. In neither of these cases, however, does the absorbance band characteristic of the vinyl ether overlap the absorbance band due to the HFP in the terpolymer. Thus, the termonomer content of these terpolymers, as well as the HFP content, can be determined directly from a single infrared scan of the film. The analytical band for PEVE occurs at 1090 cm.$^{-1}$, whereas that for PMVE occurs at 889 cm.$^{-1}$.

3. Melting Point

Melting points were determined by Differential Thermal Analysis using a Du Pont Model 900 Analyzer. The melting point is taken as the minimum on the DTA melting curve.

4. MIT Flex Life

The standard MIT folding endurance tester described in ASTM D-2176-63T was used for determining flex life. The determinations were carried out on water quenched films of approximately 0.20 to 0.23 mm. thickness. Pieces approximately 90 mm. long and 12.7 mm. wide were clamped into the jaws of the flex tester and placed under a load of 1.25 kg. The MIT flex tester folds the film through an angle of about 135° to the right and 135° to the left at a rate of about 175 cycles per minute. The number of cycles until failure is recorded on a counter on the machine. Duplicate determinations were made on each sample and the average used as the MIT Flex life of the sample. If the values for the determinations differed by more than 25%, than a third determination of the MIT flex life was obtained and the average of all three determinations was then used as the flex life of the sample.

5. Tensile Properties (Ultimate Strength-Ult. Str., Ultimate Elongation-Ult. Elong., and Yield Strength-Yield Str.)

For the measurement of tensile preperties, approximately 0.20 to 0.25 mm. thick films were prepared by compression molding at 325° C. A cycle of 4 minutes with no pressure, 2 minutes with a little pressure and 8 minutes with approximately 40 kg./cm.$^2$ pressure on the mold, was used and then the film was water quenched. Micro tensile bars were cut from the films as described in the ASTM procedure D-1708. The tensile properties were determined according to the ASTM procedure D-2116, which is the procedure for fluorocarbon molding and extrusion materials. In all the tests crosshead speed of about 50 mm. per minute was used and the chart speed was 127 mm. per minute. Usually 5 determinations were made for each sample. Measurements were made both at room temperature and at 250° C. The test specimens were allowed to equilibrate for 5 minutes at the elevated temperature prior to the testing. It was determined that this was sufficient time to bring the samples to the desired test temperature.

The following Examples are representative of the invention.

EXAMPLES 1-11

In these examples the following procedure was followed: Into an evacuated, agitated 1 liter stainless steel autoclave were charged the desired amounts of 1,1,2-trichloro-1,2,2trifluoroethane (F-113) solvent, perfluoro(propyl vinyl ether) (PPVE), and methanol (MeOH), a chain transfer agent. Then, the desired amount of hexafluoropropylene (HFP) was added from a weighed cylinder. The temperature of the mixture was raised to 60° C. and the agitator speed was adjusted to 750 rpm. Then, the autoclave was pressured with tetrafluoroethylene (TFE) monomer until the desired operating pressure was reached. To the autoclave was then charged 25 ml. of a solution of bisperfluoropropionyl peroxide (3-P) in the aforementioned solvent. The concentration of 3-P in the peroxide solution was either 0.002 or 0.005 g./ml. The above initiator solution was added continuously during the run at a rate of about 0.9 ml./min. The pressure in the autoclave was kept constant during the run by addition of TFE monomer. The run was allowed to proceed until 30 to 90 grams of terpolymer was produced. The polymerization time for these examples ranged between 20 and 60 minutes. At the end of this time, the contents of the autoclave were discharged into a large stainless steel beaker. The terpolymer was recovered by drying in an air oven at 150° C. for at least 2 hours. The polymerization conditions including reactant amounts are given in Table I.

Properties of these terpolymers are given in Table II.

TABLE I

| Example | F-113 ml | HFP g | TFE g | PPVE g | MeOH ml | 3-P Solution | Temperature ° C. | Pressure Kg/cm$^2$ | Time min. | Polymer g |
|---|---|---|---|---|---|---|---|---|---|---|
| 1 | 515 | 360 | 82 | 14 | .14 | A | 60 | 10.2 | 20 | 84.9 |
| 2 | 515 | 360 | 82 | 18 | .34 | B | 60 | 10.2 | 33 | 66.6 |
| 3 | 515 | 380 | 80 | 17 | .43 | B | 60 | 10.8 | 41 | 49.5 |
| 4 | 515 | 378 | 80 | 24 | .20 | B | 60 | 10.8 | 32 | 46.5 |
| 5 | 515 | 358 | 82 | 32 | .34 | B | 60 | 10.7 | 38 | 79.5 |
| 6 | 450 | 455 | 69 | 10 | .075 | B | 60 | 10.1 | 30 | 53. |
| 7 | 450 | 460 | 70 | 10 | .125 | A | 60 | 10.0 | 28 | 70. |
| 8 | 450 | 470 | 71 | 10 | .15 | A | 60 | 10.1 | 30 | 52.4 |
| 9 | 450 | 476 | 71 | 15 | .125 | B | 60 | 10.7 | 40 | 45. |
| 10 | 350 | 555 | 72 | 7.5 | 0 | B | 60 | 10.7 | 54 | 68.5 |
| 11 | 350 | 458 | 54 | 10 | .075 | B | 60 | 10.8 | 45 | 34.5 |

Note:
3-P Solution Concentration: A, .005 g/ml; B, .002 g/ml. Charge: Initial, 25 ml; during run, 0.9 ml/min.

TABLE II

| Example | Composition Wt. % HFP | Composition Wt. % PPVE | Melt Viscosity × 10$^{-4}$ P | Melting Pt., ° C. | MIT Flex Life (cycles) | Tensile Properties, 250° C. Yield Str. kg/cm.$^2$ | Tensile Properties, 250° C. Ult. Str. kg/cm.$^2$ | Ult. Elong., % |
|---|---|---|---|---|---|---|---|---|
| 1 | 6.8 | 1.0 | 21.5 | 294 | 53,800 | — | — | — |
| 2 | 7.2 | 1.3 | 8.4 | — | 11,400 | 26.1 | 66.2 | 342 |

TABLE II-continued

| Example | Composition Wt. % HFP | Composition Wt. % PPVE | Melt Viscosity × 10⁻⁴ p | Melting Pt., °C | MIT Flex Life (cycles) | Tensile Properties, 250° C. Yield Str. kg/cm² | Tensile Properties, 250° C. Ult. Str. kg/cm² | Ult. Elong., % |
|---|---|---|---|---|---|---|---|---|
| 3 | 6.8 | 1.3 | 2.9 | 296 | 1,900 | — | — | — |
| 4 | 7.2 | 2.1 | 16.0 | 293 | 172,500 | — | — | — |
| 5 | 6.3 | 2.6 | 9.8 | 293 | 40,600 | 25.6 | 81.0 | 389 |
| 6 | 9.0 | 1.1 | 25.3 | 289 | 53,800 | 20.4 | 61.3 | 311 |
| 7 | 7.7 | 0.9 | 9.6 | — | — | 24.6 | 50.6 | 287 |
| 8 | 9.0 | 1.0 | 8.7 | — | 15,600 | 22.4 | 58.4 | 380 |
| 9 | 9.0 | 2.0 | 4.1 | — | 8,300 | 20.7 | 47.3 | 379 |
| 10 | 10.8 | 1.7 | 24.6 | 272 | 178,000 | — | — | — |
| 11 | 10.8 | 1.3 | 6.7 | 274 | 8,700 | 19.8 | 28.3 | 334 |

— means not measured

EXAMPLES 12 AND 13 AND COMPARISON A

These polymerizations were all carried out as those described in the preceding Examples. However, in Example 13 and in Comparison A, perfluoroethyl perfluorovinyl ether (PEVE) and perfluoromethyl perfluorovinyl ether (PMVE), respectively, were substituted for PPVE in the polymerization mixture. The conditions and results are given in Tables III and IV, respectively. These experiments illustrate the importance of the bulkiness of the perfluoroalkyl group in the vinyl ether as it affects the toughness of the resulting terpolymer. Whereas both the perfluoroethyl and perfluoropropyl perfluorovinyl ether terpolymers had high toughness as indicated by MIT flex life, the perfluoromethyl perfluorovinyl ether terpolymer had grossly inferior toughness even though it had a higher termonomer content.

ultimate strength and the ultimate elongation values of the TFE/HFP copolymer are below the values for the terpolymers of this invention that are set forth in Table II when measured at 250° C.

TABLE V

PROPERTIES OF COPOLYMERS

| Comparative Example | Copolymer | Comonomer Content | Melt Viscosity × 10⁴ p | Tensile Properties, 250° C. Ult. Strength Kg./cm.² | Tensile Properties, 250° C. Ult. Elongation % |
|---|---|---|---|---|---|
| Comparison B | TFE/HFP | 15 | 7.2 | 14.2 | 152 |
| Comparison C | TFE/PPVE | 4 | 4.7 | 85 | 569 |

COMPARISON D

A terpolymer of this invention, a TFE/HFP copolymer and a TFE/PPVE copolymer, were each made into a film and compared for their heat-shrinkable properties.

The films were prepared by compression molding and had the following dimensions: 0.51 mm. thick, 25 mm. wide, and 100 mm. long. The films were scribed with two marks 50 mm. apart perpendicular to the direction to be stretched. The films were stretched in an Instron with a controlled heat chamber set at either 130° or 150° C. The films were stretched 60% over their original length at a crosshead speed of about 50

TABLE III

PREPARATION OF TERPOLYMERS

| Example | F-113 ml. | HFP g. | TFE g. | Vinyl Ether Name | Vinyl Ether Wt., g. | MeOH ml. | 3-P Sol'n. g./ml. | Temp. °C. | Press. Kg./cm.² | Time min. | Polymer g. |
|---|---|---|---|---|---|---|---|---|---|---|---|
| 12 | 515 | 352 | 82 | PPVE | 18 | 0.34 | .002 | 60 | 11.1 | 35 | 52 |
| 13 | 515 | 351 | 82 | PEVE | 22.4 | 0.34 | .002 | 60 | 10.6 | 34 | 65 |
| Comparison A | 515 | 350 | 82 | PMVE | 21.8 | 0.34 | .002 | 60 | 10.9 | 35 | 61 |

Note: 25 ml. 3-P solution added initially followed by 0.9 ml./min. during run.

TABLE IV

PROPERTIES OF TERPOLYMERS

| Example | Composition HFP Wt. % | Composition Vinyl Ether Name | Composition Vinyl Ether Wt. % | Melt Viscosity × 10⁻⁴p | Melting Pt., °C. | MIT Flex Life (cycles) |
|---|---|---|---|---|---|---|
| 12 | 6.3 | PPVE | 0.8 | 8.1 | 294 | 8,500 |
| 13 | 4.5 | PEVE | 1.2 | 6.4 | 291 | 12,400 |
| Comparison A | 5.0 | PMVE | 3.8 | 5.6 | 291 | 860 |

COMPARISONS B AND C

These comparisons show, in Table V, tensile properties of a TFE/HFP copolymer and a TFE/PPVE copolymer. By comparison with Table II it is seen that the mm./min. Then the crosshead was stopped and the film samples were cooled quickly with a wet towel and removed from the chamber. The distance between the two marks was measured on each stretched film—both immediately and after standing at room temperature for 24 hours. The percentage elongation retained after stretching was then calculated—based on the final measurement value. The films were then shrunk by heating them, unrestrained, for 30 minutes at either 130° or 150° C., depending on the stretching temperature used. The distance between the two marks on the films was again measured and the amount of residual elongation which remained after shrinking was calculated.

It is seen from Table VI that, at either test temperature (130° or 150° C.), the TFE/HFP copolymer and the terpolymer samples had comparable heat shrinkage properties which were superior to that of the TFE/PPVE copolymer. This is indicated in the last column in the Table. This represents the usable amount of heat shrinkage which is available for design of a heat shrinkable tubing. The terpolymer and TFE/HFP copolymer have 40–50% more "heat shrinkability" than the TFE/PPVE copolymer. Thus, heat shrinkable tubes made from the terpolymer or FEP copolymer can be used over a larger range of sizes of rolls than can tubes made from TFE/PPVE copolymers.

TABLE VI

HEAT SHRINKABLE PROPERTIES OF TFE/HFP/PPVE TERPOLYMER VS. TFE/HFP (FEP) AND TFE/PPVE (PFA) COPOLYMERS

| Example | Sample* | Stretch and Shrink Temp, °C. | Elongation, % | | |
|---|---|---|---|---|---|
| | | | Retained, after Stretching (a) | Residual, after Shrinking (b) | Change, (a)–(b) |
| A | Terpolymer | 130 | 44 | 4 | 40 |
| B | TFE/HFP Copolymer | 130 | 45 | 5 | 40 |
| C | TFE/PPVE Copolymer | 130 | 32 | 5 | 27 |
| D | Terpolymer | 150 | 45.5 | 2.5 | 43 |
| E | TFE/HFP Copolymer | 150 | 47 | 3 | 44 |
| F | TFE/PPVE Copolymer | 150 | 34 | 3 | 31 |

*Sample Description
Terpolymer—7.8 wt % HFP, 1.1 wt % PPVE, MV = 44×10$^4$p
TFE/HFP Copolymer—15.8 wt % HFP, MV = 50×10$^4$p
TFE/PPVE Copolymer—3.3 wt % PPVE, MV = 27×10$^4$p The embodiments of the invention in which an exclusive property or privilege is claimed are defined as follows:

1. A solid, substantially nonelastomeric terpolymer consisting of, in copolymerized form,
 a. tetrafluoroethylene,
 b. between about 4 and about 12 weight percent hexafluoropropylene, and
 c. between about 0.5 and about 3 weight percent of either perfluoro(ethyl vinyl ether) or perfluoro(n-propyl vinyl ether),
said weight percent being based on weight of terpolymer, wherein the terpolymer has a melt viscosity of between about $10^3$ and $10^7$ poise at 372° C.

2. The terpolymer of claim 1 wherein monomer (c) is perfluoro(propyl vinyl ether).

3. The terpolymer of claim 2 wherein monomer (b) is present in an amount of between about 5 and 8 weight percent and monomer (c) is present in an amount of between about 0.75 and 2.0 weight percent.

* * * * *